United States Patent [19]

Rogers et al.

[11] Patent Number: 4,527,119
[45] Date of Patent: Jul. 2, 1985

[54] HIGH SPEED, LOW MASS, MOVABLE PROBE AND/OR INSTRUMENT POSITIONER, TOOL AND LIKE ITEMS SUITABLE FOR USE IN A CONTROLLED ENVIRONMENT CHAMBER

[75] Inventors: David P. Rogers; Donald J. Geisel, both of Clifton Park, N.Y.

[73] Assignee: Testamatic, Incorporated, Latham, N.Y.

[21] Appl. No.: 379,004

[22] Filed: May 17, 1982

[51] Int. Cl.³ .................... G01R 31/02; G01D 15/16
[52] U.S. Cl. ................ 324/158 F; 33/1 M; 346/139 B
[58] Field of Search ............. 324/158 F, 158 P, 72.5, 324/73 AT; 346/139 B; 74/89.2, 89.22; 33/1 M

[56] References Cited
U.S. PATENT DOCUMENTS 3,611,819 10/1971 Muller et al. ................... 346/139 B
4,362,991 12/1982 Carbine ........................ 324/158 F Primary Examiner—Ernest F. Karlsen
Attorney, Agent, or Firm—Charles W. Helzer

[57] ABSTRACT

A high speed, low mass positioning apparatus is provided for positioning a test probe or other like item at any desired point within an x-y plane. The apparatus comprises a first axis of movement mechanism for positioning the item along one axis of movement and a second axis of movement mechanism for positioning the item along the remaining transverse axis of movement. Both of the axis of movement mechanisms comprise motor driven pulley wheel and drive cable arrangements arrayed around the outer periphery of the x-y planar surface area within which it is desired to position a test probe, tool or other like item. A light inflexible track member is secured between and carried by two spaced-apart movable trucks and is movable therewith in either direction along the said one axis of movement. A small lightweight movable carrier is movably supported on the track member and is movable therealong in either direction. The remaining axis of movement mechanism is arranged to move the small lightweight movable carrier back and forth in either direction along the track member. One side of a movable fine wire loop is secured to and moved by the small lightweight movable carrier and a test probe or other like item is secured to and movable with the other side of the movable fine wire loop whereby the test probe or other item can be positioned at any desired point within the planar x-y surface area. The apparatus is designed to be mounted within the interior of a substantially airtight, environmentally controlled test chamber.

9 Claims, 6 Drawing Figures

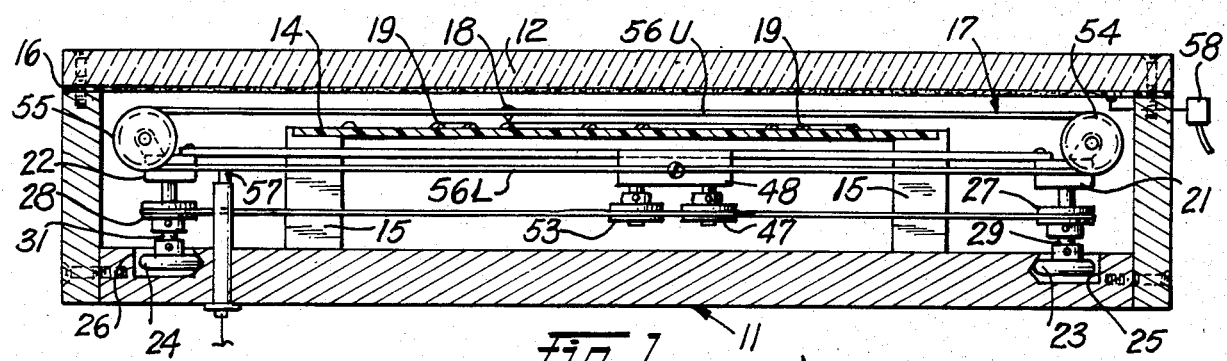
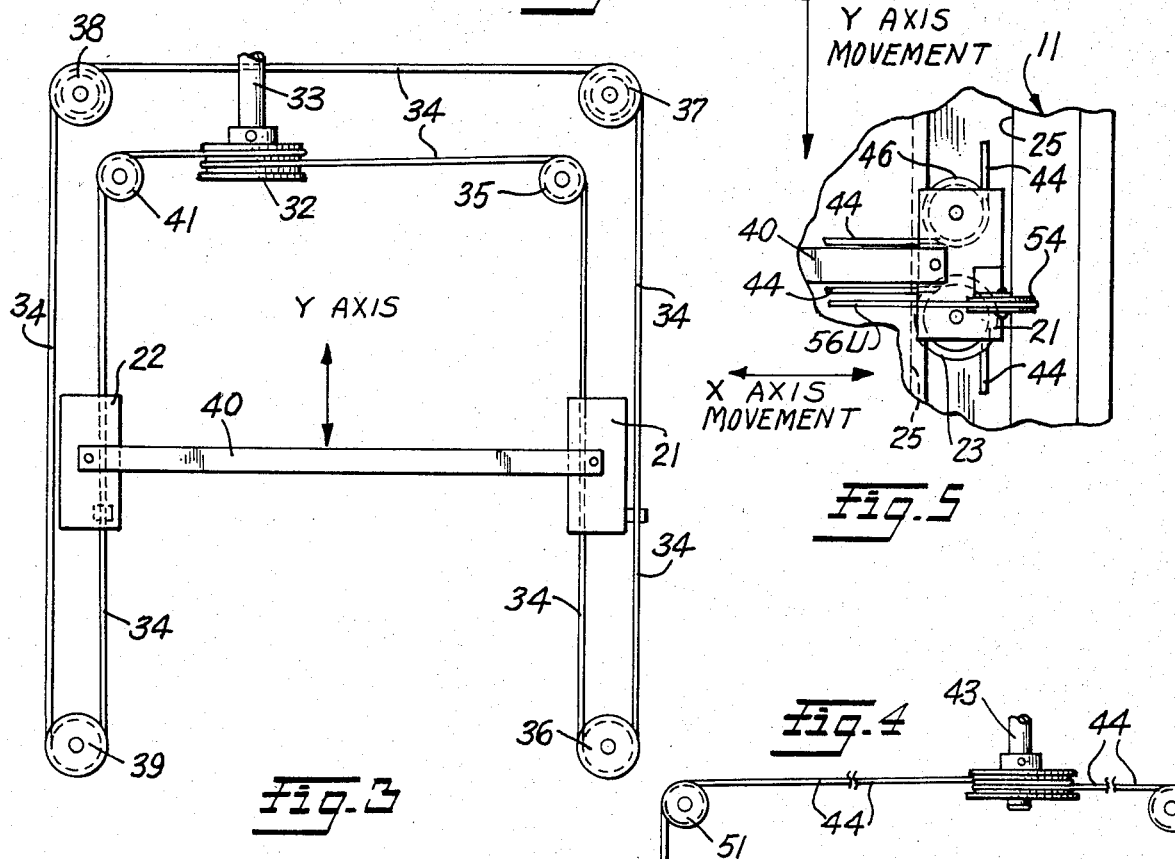

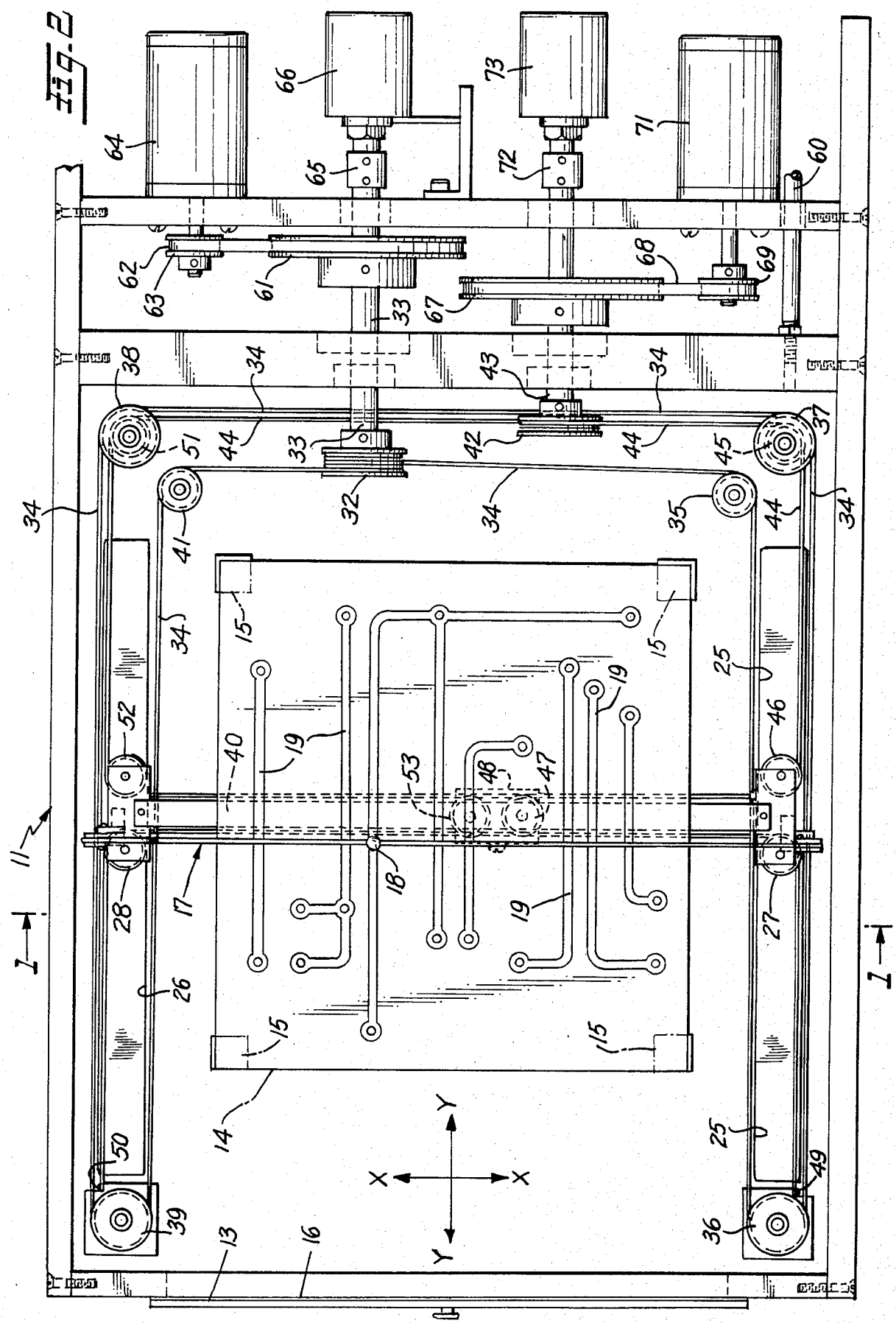

HIGH SPEED, LOW MASS, MOVABLE PROBE AND/OR INSTRUMENT POSITIONER, TOOL AND LIKE ITEMS SUITABLE FOR USE IN A CONTROLLED ENVIRONMENT CHAMBER

TECHNICAL FIELD

This invention relates to high speed, low mass, inexpensive, lightweight apparatus for positioning small probes, instruments, tools and other like items at relatively fast speeds.

More particularly, the invention relates to such a low mass, high speed positioning apparatus which may be used within an enclosed environmentally controlled test chamber without blocking the view of an object being tested within the chamber.

BACKGROUND PRIOR ART

Prior art automatic positioning devices typically moved either the entire object under test on an x-y movable table on which the object rests or utilized a large, movable holder for the x-y movable probe, tool or other like item. X-y movable tables generally are fabricated from precision machined metal plates and castings in order to provide stability and repeatability. As a result, they tend to be large, heavy, costly and slow moving. For a given size test piece, such as a printed circuit board, an x-y table would require an area of about four times the size of the test piece. In the prior art positioning devices wherein the test piece is stationary and a probe, tool or other like item is moved, the probes, tools, etc. generally required a support bracket assembly or fixture which often is several times larger than the size of the probe or tool being held. Because of the mass of the movable bracket assembly or support fixture, quick position changes of the probe cannot be achieved. Due to their size and weight, it is difficult and expensive, and hence impractical to put these prior art automatic positioning devices in a controlled environment chamber, if desired or necessary. Further, if used, the prior art positioning devices would block the view from above of a test piece such as a circuit board under test within the controlled environment test chamber.

To overcome the above difficulties, the present invention was devised.

SUMMARY OF INVENTION

A primary object of this invention is to provide a high speed, low mass, compact, relatively inexpensive automatic positioning apparatus which may be used for high speed positioning or locating of small probes, contacts, test instruments, tools and other similar items at desired points on or near an article that is under examination, test or fabrication.

Another object of the invention is to provide such an automatic positioning device which can be used within a controlled environment test chamber, but which will not block a view of an article under test within the controlled environment test chamber.

In practicing the invention, a high speed, low mass positioning apparatus is provided for positioning a test probe or other like item at an desired point within an x-y plane. The apparatus comprises a first axis of movement means for positioning the item along one axis of movement and a second axis of movement means for positioning the item along the remaining transverse axis of movement in an x-y plane. Each of the axis of movement means comprise motor driven pulley wheel and drive cable arrangements which are arrayed around the outer periphery of the x-y planar surface area within which it is desired to position a test probe, tool or other like item. One of the axis of movement means is arranged to move a set of spaced-apart movable trucks in either direction along two spaced-apart parallel boundaries of the x-y planar surface area defining one axis of movement. A light inflexible track member is secured between and carried by the two spaced-apart movable trucks and is movable therewith in either direction along said one axis of movement. A small lightweight movable carrier is movably supported by the track member and is movable therealong in either direction with the other of the said axis of movement means being arranged to move the small lightweight movable carrier back and fourth in either direction along the track member so as to position the lightweight carrier and a test probe, tool or other item moved thereby at any desired point within the x-y planar surface area.

The positioning apparatus further includes a respective pulley wheel mounted on each of the movable trucks and movable therewith. The truck mounted pulley wheels support a movable fine wire loop therebetween which extends along the same axial direction as the track member with one side of the movable fine wire loop being secured to and moved by the small lightweight movable carrier and with a test probe, tool or other like item secured to and movable with the other side of the movable fine wire loop whereby the test probe, tool or other like item can be positioned at any desired point within the planar x-y surface area.

The positioning apparatus is specially designed for positioning a test probe relative to the surface of a printed wiring board, ceramic substrate having conductive pathways thereon, and other like items with the printed circuit board or other like item being disposed in the space between the two sides of the movable fine wire loop extending between the truck mounted pulley wheels in a position to have different conductive paths, pads and runs on the surface of the printed wiring board contacted by the test probe. Further, the apparatus is designed to fit readily within the interior of substantially airtight, environmentally controlled test chamber with the set of spaced-apart movable trucks being supported by and movable along a set of spaced-apart tracks secured on opposite sides of the base of the test chamber. The test chamber preferably includes a transparent window partition through which the surface of a printed circuit board or other like item under test can be readily viewed with only the movable fine wire supporting the movable test probe interposed between the surface of the printed circuit board under test and the transparent window partition whereby the view of the surface of the printed circuit board or other item under test by an observer looking through the window is not obscured by the high speed, low mass positioning apparatus.

BRIEF DESCRIPTION OF DRAWINGS

These and other features and many of the attendant advantages of this invention will be better understood and more fully appreciated upon a reading of the following detailed description when considered in conjunction with the accompany drawings, wherein like parts in each of the several figures are identified with the same reference character; and wherein:

FIG. 1 is a longitudinal sectional view of an environmentally controlled, substantially airtight test chamber having a high speed, low mass movable probe and instrument positioner disposed therein and constructed in accordance with the invention;

FIG. 2 is a top plan view of the controlled environment test chamber and high speed, low mass positioning apparatus shown in FIG. 1;

FIG. 3 is diagramatic sketch of the y drive pulley wheel and drive cable mechanism for achieving movement of the test probe along the y axis dimension and comprising a part of the apparatus shown in FIGS. 1 and 2;

FIG. 4 is a diagramatic sketch illustrating the x drive pulley wheel and drive cable mechanism for achieving x axis movement of a test probe with the positioning apparatus shown in FIGS. 1 and 2;

FIG. 5 is a partial, schematic view illustrating the construction of one of the movable trucks comprising a part of the y axis pulley wheel and drive cable drive mechanism and comprising a part of the system shown in full in FIG. 3; and FIG. 6 is a partial end sectional view of the test chamber and positioning apparatus showing in greater detail the construction of the movable truck assembly and the manner in which its wheel drive is supported in v-shaped grooves in the base of the environmentally controlled chamber.

BEST MODE OF PRACTICING INVENTION

FIG. 1 is a longitudinal sectional view of an environmentally controlled test chamber 11 having a transparent window partition or cover 12 and a door 13 through which items to be tested such as a printed circuit board shown at 14 can be inserted and supported in place on an insulating support table 15 secured to the base of the test chamber 11. The door 13 and window 12 are provided with gasket seals 16 so that these openings readily can be sealed closed and a suitable gaseous mixture (not shown) can be introduced into the interior of chamber 11 to produce cathode liminescence for testing purposes as explained more fully in co-pending U.S. application Ser. No. 379,005, filed concurrently with this application on May 17, 1982 entitled "Method and Apparatus for Electrical and Mechanical Inspection and Testing of Printed Circuit Boards and other Items"—Donald J. Geisel, Inventor, the disclosure of which is hereby incorporated in its entirety into the disclosure of this application.

A high speed, low mass positioning apparatus is movably supported within chamber 11 for positioning a test probe shown at 18, an instrument, tool or other like item at any desired point within an x-y planar area on the surface of the printed circuit board 14 in order to contact a particular pad, conductive pathway, trace or run shown at 19 on the surface of the printed circuit board (PCB). As viewed in FIG. 1, the high speed, low mass positioning apparatus 17 is comprised by a pair of movable trucks 21 and 22 that are moved back and forth into and out of the plane of the drawing by respective drive wheels 23 and 24 supported in respective v-shaped grooves 25 and 26 formed in the right and left hand marginal sides of the base of test chamber 11, respectively.

The truck assemblies 21, 23, 27 and 29, and 22, 24, 28 and 31 comprise part of a first or y axis movement means or mechanism for positioning the probe 18 right or left as viewed in FIG. 2 along a first axis of movement which shall be defined to be the y axis, as explained more fully hereafter. The right and left movement of probe 18 relative to FIG. 1 of the drawings shall be defined to be the movement of the probe along the x axis.

From FIG. 2 of the drawings, it will be seen that both axis of movement means for moving probe 18 along either the x or y axis as defined and shown by the arrows in the center of FIG. 2, comprise motor driven pulley wheel and drive cable arrangements which are arrayed around the outer periphery of the x-y planar surface area within which it is desired to position probe 18. The pulley wheel and drive cable arrangement designed to move the truck assemblies 21 and 22 along the y axis is best seen in FIG. 3 of the drawings wherein an electric motor driven pulley wheel 32 is shown at the top of the figure and can be rotated in either direction by an electric motor driven drive shaft 33. The y axis drive cable 34 has one or two turns formed around the drive pulley 32 and then extends over to the right around a first direction changing pulley 35 downward to and around a direction reversing pulley 36 back up past truck assembly 21 to which it is clamped, hence up to a second direction changing pulley 37. From pulley wheel 37 the drive cable 34 extends over to the left to a third direction changing pulley wheel 38 and thence downwardly to a fourth direction reversing pulley wheel 39. From the direction changing pulley wheel 39, the y axis drive cable 34 extends upwardly past the truck assembly 22 to which it is secured and thence up to a fourth direction changing pulley wheel 41 back to the original starting point on the drive pulley wheel 32. With this pulley wheel and drive cable arrangement, it will be appreciated that if the drive pulley wheel 32 is rotated in a clockwise manner, the drive cable 34 will be paid out to the right and taken up on the left as viewed in FIG. 3. This will result in moving the truck assemblies 21 and 22 upwardly together with a lightweight metal track member 40 which is supported by and extends between the two truck assemblies 21 and 22. Conversely, if the drive pulley wheel 32 is rotated in a counter-clockwise direction, drive cable 34 will be taken up on the right and paid out on the left to cause the two truck assemblies and metal track member 40 to be moved downwardly as shown in FIG. 3.

FIG. 4 is a simplified, functional sketch of the x axis pulley wheel and drive cable arrangement for moving the probe 18 right and left as shown in FIG. 1 or up and down as shown in FIG. 2 along the x axis independently of movement imparted to the probe in the y axis direction by the arrangement shown in FIG. 3. The x axis pulley wheel and drive cable arrangement is comprised by an electric motor driven pulley wheel 42 which may be rotated in either direction by a drive shaft 43 connected to an electric drive motor (not shown in FIG. 4). Formed around the x axis drive pulley 42 are several turns of a x axis drive cable 44 which extends to the right to a first direction changing pulley wheel 45 thence down to a second direction changing pulley wheel 46 and then around the first direction reversing pulley wheel 47 rotatably mounted on the movable with a small lightweight carrier 48 slidably supported on the track member 40. The purpose of the small lightweight carrier 48 will be described more fully hereafter with relation to FIG. 1 of the drawings. From direction reversing pulley 47, the x axis drive cable 44 extends back to the right around a third direction changing pulley 27 also shown in FIG. 1 and thence downwardly to an anchor point shown at 49. X axis drive cable 44 also extends to the left from the x axis drive pulley 42 around a fourth direction changing pulley 51 downwardly to a fifth direction changing pulley 52 out to the right and around a second direction reversing pulley 53 also rotatably mounted on and movable with the small lightweight carrier 48. It should be noted at this point that while the track 40 has been eliminated from FIG. 4 for the purpose of simplicity and in order not to complicate illustration of the x axis drive cable 44 in this area, the lightweight track member 40 would extend substantially coextensively with the portion of the x axis drive cable 44 shown extending between the two truck assemblies 21 and 22. From the direction reversing pulley 53, the x axis drive cable 44 extends back to the left around a sixth direction changing pulley 28 also shown in FIG. 1 and thence downwardly to a second anchor point 50. With this drive pulley and cable arrangement, it will be appreciated that if the drive pulley 42 is rotated in a clockwise direction as viewed in FIG. 4, cable 44 will be paid out to the right and taken up on the left. This will result in moving the small lightweight carrier 48 to the left from the position shown in FIG. 4. Conversely, if the drive pulley 42 is rotated in a counterclockwise direction, cable 44 will be paid out to the left and taken up on the right. This will result in moving the small lightweight carrier 48 to the right from its position shown in FIG. 4.

As best shown in FIG. 2 of the drawings, the y axis drive shaft 33 is keyed to a driven pulley wheel 61 coupled by belt 62 to a drive pulley wheel 63 driven by a reversible, y axis drive motor 64. A coupling 65 also directly couples shaft 33 to a y axis potentiometer 66 for deriving an output electrical signal representative of the y axis position of the truck assemblies 21, 22 and lightweight metal track 40. Similarly, the x axis drive pulley 42 is coupled through drive shaft 43 to an x axis drive pulley 67 driven by belt 68 from a driver pulley 69 that in turn is shafted to and driven by a x axis, reversible electric drive motor 71. The x axis drive shaft 43 is also coupled through a coupling 72 to an x axis position potentiometer 73 for developing an output electric position signal representative of the x axis position of the small lightweight carrier 48 along the length of the metal track 40.

As best shown in FIGS. 1, 5 and 6 of the drawings, the movable truck assemblies 21 and 22 each mount respective additional rotatable pulley wheels 54 and 55 which support therebetween a movable fine wire loop 56U and 56L with the probe 18 being secured to the upper portion 56U of the fine wire loop. The lower portion 56L of the fine wire loop is secured to the small lightweight carrier 48 that rides on track 40. The arrangement is such that the small lightweight carrier 48 and track 40 are all disposed in the space between the upper and lower fine wire loops 56U and 56L and also are disposed beneath the insulating table 15 on which the printed circuit board 14 rests within test chamber 11. The upper fine wire loop 56U and probe 18 therefore are the only elements of the positioning apparatus which are disposed over the top surface of the printed circuit board 14 under test and therefore do not obscure the view of an observer looking at the top surface of the printed circuit board through the transparent window partition 12. The dimensions of the insulating support table 15 as well as any printed circuit board, ceramic substrate or other like item being acted upon by the positioning apparatus are such that they are within the inside dimension of the tracks 25 and 26 for the movable truck assemblies 21 and 22 and do not interfere with the movement of this assembly and interconnecting track member 40 back and forth along the y axis. Similarly, in the other dimension, the legs of the insulating table 15 are positioned outside or beyond the extent of movement along the y axis of the truck assemblies 21 and 22 so as not to interfere with movement of the small lightweight carrier 48 back and forth along the x axis dimension of the apparatus. It will be appreciated that because the lower portion 56L of the movable fine wire loop is secured at 57 to the lightweight carrier 48, as the carrier is moved back and forth along the x axis, it will correspondingly move the probe 18 secured to the upper loop portion 56U back and forth along the x axis of the apparatus.

As disclosed in the above-referenced co-pending U.S. application Ser. No. 379,005, the novel low mass, high speed positioning apparatus herein described is intended primarily for use in testing printed circuit boards, ceramic substrates and other items for continuities and discontinuities in an electrical sense by the production of "cathode luminescence" within the chamber 11. For this purpose, a test electric potential of between 200 to 900 volts is applied between conductive fine wire loop 56 and probe 18 and the transparent window partition 12 which also is electrically conductive. To accomplish this, one terminal 57 is provided for applying one terminal of the test electric potential source to the movable fine wire loop 56U and a second terminal 58 is connected to the conductive layer of transparent, conductive window 12.

In operation, after a test PCB, ceramic substrate or other like item has been placed in the test chamber through door 13 and is position as shown at 14 in FIG. 2 of the drawings, resting on insulating support table 15, a charge of a gaseous mixture capable of "cathode luminescence" is introduced into the chamber thru 60 after closure and sealing of the door 13. Concurrently with this operation, x and y axis coordinate position signals are supplied to the respective x and y drive motors 71 and 64 to cause the peripherally arrayed drive pulley and cable arrangements to respectively position the truck assemblies 21 and 22 together with metal track 40 at the desired y axis coordinate position. Simultaneously, and independently of the y axis positioning, the x axis drive pulley and cable arrangement causes the small lightweight carrier 48 to position the probe 18 at the desired x axis position so as to cause probe 18 to contact a particular pad, conductive pathway, trace or run located at the given x-y coordinate position on the planar surface of the printed circuit board, or other like item being tested. Because of its low mass, and low friction, positioning of the probe 18 to any desired x-y coordinate position on the planar surface of the test printed circuit board can be accomplished in a fraction of a second. In one specific embodiment of the invention, it is possible to contact on the order of 100 different test points on the surface of the test printed circuit board in 1.4 seconds, 500 points within 7 seconds and 1,024 points within 14 seconds. These times are approximate and based upon 4 points per continuity string or conductive pathway run on any given test printed circuit board. The load and unload time to complete one cycle of testing for a given printed circuit board is approximately 30 seconds.

From the foregoing description, it will be appreciated that the invention provides a high speed, low mass, compact, relatively inexpensive automatic positioning apparatus which may be used for the high speed positioning or locating of small probes, contacts, test instruments, tools and other similar items at desired points within an x-y planar surface on or near an article that is under examination, test or fabrication. The apparatus is specifically designed so that it can be used within a controlled environment test chamber but is so small that it does not block a view of an article under test or being fabricated within the controlled environment test chamber by an observer looking through a window partition formed in the side of the test chamber.

INDUSTRIAL APPLICABILITY

This invention provides a low cost, high speed, compact, low mass automatic positioning device which may be used to position or locate small probes, contact points, instruments, tools or other similar items on or near an article which is under examination, test or fabrication. The apparatus is particularly designed for use within environmentally controlled test chambers or it can be used at normal room conditions and where used it allows maximum view from above of an item under test, examination, or fabrication.

Having described a preferred embodiment of a novel high speed, low mass positioning apparatus constructed in accordance with the invention, it is believed obvious that changes, additions and variations may be made in the particular embodiment of the invention described which are within the full intended scope of the invention as defined by the appended claims.

What is claimed is:

1. A high speed, low mass positioning apparatus for positioning a test probe at any desired point within an x-y plane comprising a first axis of movement means for positioning the probe along one axis of movement and a second axis of movement means for positioning the probe along the remaining transverse axis of movement, both of said axis of movement means comprising motor driven pulley wheel and drive cable arrangements arrayed around the outer periphery of the x-y planar area within which it is desired to position the test probe, one of said axis of movement means being arranged to move a set of spaced-apart movable trucks in either direction along two spaced-apart parallel boundaries defining the opposite side of the x-y planar area, a light inflexible track member secured between and carried by said two spaced-apart movable trucks and movable therewith in either direction along said one axis of movement, a small lightweight movable carrier movably supported by said track member and movable therealong in either direction transverse to said one axis of movement, the other of said axis of movement means being arranged to move said small lightweight movable carrier back and forth in either direction along the second axis of movement on said track member, a respective pulley wheel mounted on each of said movable trucks and movable therewith, said truck mounted pulley wheels supporting a movable conductive fine wire endless loop therebetween which extends along the same axial direction as the track member, one side of the movable fine wire loop being secured to and moved by the small lightweight movable carrier, means for electrically insulating said conductive fine wire endless loop from the truck mounted pulley wheels and said movable carrier, and an electrically conductive test probe secured to and movable with the other side of the movable conductive fine wire loop whereby the electrical test probe can be positioned at any desired point within the planar x-y area.

2. A positioning apparatus according to claim 1 wherein the apparatus is designed for positioning a test probe relative to the surface of a printed wiring board, ceramic substrate having conductive pathways thereon and other like items and wherein the printed circuit board or other item is disposed in the space between the two sides of the movable fine wire loop extending between the truck mounted pulley wheels in a position to have different conductive paths, pads and runs on its surface contacted by the test probe.

3. A positioning apparatus according to claim 2 wherein the apparatus is designed to be mounted within the interior of a substantially airtight test chamber with said set of spaced-apart movable trucks being supported by and movable along a set of spaced-apart tracks secured on opposite sides of the base of the test chamber.

4. A positioning apparatus according to claim 3 wherein the test chamber includes a transparent window partition through which the surface of a printed circuit board or other item under test can be readily viewed with only the movable fine wire supporting the movable test probe interposed between the surface of the printed circuit board and the transparent window partition whereby the view of the surface of the printed circuit board by an observer looking through the window is not obscured by the positioning apparatus.

5. A positioning apparatus according to claim 4 further including means for applying one terminal of a test electric potential to the test probe supported by the movable fine wire loop and means for applying a remaining terminal of the test electric potential to a conductive surface within said test chamber opposite said printed circuit board to thereby produce an electric field between selected conductive pathways on the printed circuit board and the conductive surface.

6. A positioning apparatus according to claim 5 wherein the transparent window partition also is electrically conductive and comprises the conductive surface to which the remaining terminal of the test electric potential is applied.

7. A positioning apparatus according to either of claim 1 or claim 6 further including respective x and y axis controllable electric drive motors coupled to and driving the respective x and y axis pulley wheel and drive cable arrangements and respective x and y axis position electric signal transducers coupled to said respective x and y axis controllable electric drive motors for deriving output electric position signals representative of the planar x-y positioning of the probe or other like item for supply to a controller for the respective electric drive motors.

8. In a method for the high speed positioning of a low mass test electric probe at any desired point within an x-y planar surface utilizing motor driven pulley wheel and drive cable arrangements, an elongated lightweight inflexible track supported between two spaced-apart movable trucks and a small lightweight carrier movably supported on the track; the improvement comprising arraying respective x and y axis movement motor driven pulley wheel and drive cable arrangements around the outer periphery of the x-y planar surface, driving the spaced-apart movable trucks in either direction along two spaced-apart parallel boundaries of the x-y planar surface defining one axis of movement with one of the motor driven pulley wheel and drive cable arrangements, supporting the elongated lightweight inflexible track between the spaced-apart movable trucks at substantially right angles to the direction of movement of the trucks to define the remaining transverse axis of movement, driving the small lightweight carrier in either direction along a second axis of movement on the track with the remaining motor driven pulley wheel and drive cable arrangements, mounting respective additional pulley wheels on each of said spaced-apart trucks and supporting a fine movable electrically conductive wire loop therebetween with the loop of the wire extending along the track on either side thereof, electrically insulating the loop of wire from other components of the high speed positioning arrangement including the movable carrier, securing the portion of the loop on the underside of the track to the small, lightweight movable carrier and securing an electrical test probe to the remaining side of the fine wire loop for movement back and forth along the second axis of movement by said small lightweight carrier to thereby position the electrical test probe at any desired point within the planar x-y area.

9. The method according to claim 8 for use in applying a test electric potential to a point on the x-y planar surface of a printed circuit board and the like wherein the printed circuit board is supported in the space between the two sides of the movable fine wire loop in a position to have different conductive paths, pads and runs on the surface thereof contacted by the electrical test probe.

* * * * *